United States Patent [19]

Wenham et al.

[11] Patent Number: 5,646,397
[45] Date of Patent: Jul. 8, 1997

[54] OPTICAL DESIGN FOR PHOTO-CELL

[75] Inventors: Stewart Ross Wenham, Illawong; Martin Andrew Green, Waverley, both of Australia

[73] Assignee: Unisearch Limited, Kensington, Australia

[21] Appl. No.: 689,225

[22] Filed: Aug. 7, 1996

Related U.S. Application Data

[63] Continuation of Ser. No. 211,210, filed as PCT/AU92/00536, published as WO93/07646, Apr. 15, 1993, abandoned.

[30] Foreign Application Priority Data

Oct. 8, 1991 [AU] Australia .................. PK8787

[51] Int. Cl.⁶ .................. H01J 3/14; F16K 3/36
[52] U.S. Cl. .................. 250/216; 250/203.4; 136/246; 126/698
[58] Field of Search .................. 250/203.3, 203.4, 250/216; 136/246, 259; 359/591, 592, 595, 597, 598; 126/698–700

[56] References Cited

U.S. PATENT DOCUMENTS

| | | |
|---|---|---|
| 4,321,417 | 3/1982 | Kurth et al. . |
| 4,360,701 | 11/1982 | Evans, Jr. . |
| 4,522,193 | 6/1985 | Bates .................. 126/698 |
| 4,962,450 | 10/1990 | Reshetin . |
| 4,996,632 | 2/1991 | Aikens . |
| 5,039,352 | 8/1991 | Mueller et al. .................. 136/246 |

FOREIGN PATENT DOCUMENTS

| | | |
|---|---|---|
| 2093688 | 9/1989 | Australia . |
| 400367 | 5/1990 | European Pat. Off. . |
| 2400261 | 9/1979 | France . |
| 3718844 | 12/1988 | Germany . |
| 62-266879 | 11/1987 | Japan . |
| WO8906051 | 6/1989 | WIPO . |
| WO9211557 | 7/1992 | WIPO . |

OTHER PUBLICATIONS

Culik et al., "Deeply–Grooved Silicon Concentrator Solar Cells for Use with Prismatic Covers" (Conference Record of the Twenty–First IEEE Photovoltaic Specialists Conference–1990, vol. I, 21 May 1990, pp. 251–256).

Richards, L.B., "Photodetector as Function Detector," IBM Technical Disclosure Bulletin, vol. 13, , No. 3; Aug., 1970, pp. 591–592.

Mills et al., "Ideal Prism Solar Concentrators," Solar Energy, vol. 21, 1978, pp. 423–430.

*Primary Examiner*—Stephone Allen
*Attorney, Agent, or Firm*—Brumbaugh, Graves, Donohue & Raymond

[57] ABSTRACT

A combination comprises a device for receiving and for directing incoming light in a three dimensional manner to at least one predetermined location together with a solar cell. The device has two light reflecting surfaces and a total internal reflection surface. In operation, the total internal reflection surface transmits the incoming light into the device and totally internally reflects the light reflected from the surface which is incident at its surface at an angle within the range for total internal reflection. The reflection surfaces are operatively disposed with respect to one another so as to perform the function of a receiver/director by directing incoming light in a three dimensional manner to the rear surface of the solar cell.

26 Claims, 6 Drawing Sheets

OPTICAL DESIGN FOR PHOTO-CELL

This application is a continuation of application Ser. No. 08/211,210, filed as PCT/AU92/00536, Oct. 7, 1992, published as WO93/07646, Apr. 15, 1993, now abandoned.

TECHNICAL FIELD

This invention relates to a device for receiving and for directing light in a three dimensional manner to at least one predetermined location and a combination of the device and a photo-device having a light absorbing surface.

BACKGROUND ART

Light trapping within silicon substrates for solar cells has received considerable attention in recent years. The highest efficiency silicon solar cell reported by Wang et alia, Appl. Phys. Lett. 57 (6), p. 602, has been measured to have an efficiency of 24.2% under standard test conditions. Such high performance silicon cells make extensive use of geometrical structures chosen to cause light to be multiply totally internally reflected giving substantial increases for the pathlength the light traverses before escaping from the silicon. Due to the large difference between the refractive index of silicon and that of air, such light trapping schemes can be designed relatively simply while being quite effective. For a transparent medium such as glass, however, where the refractive index is only about 1.5 or less, it is relatively more difficult to totally internally reflect virtually all light within the transparent medium that strikes the air interface. This is because the escape angle for glass and similar refractive index media is approximately 45°, with the consequence that all light within the glass that strikes the glass/air interface within 45° to the normal will escape to the air.

In the area of concentrator solar cells, various schemes and designs for the optics have been proposed for the purpose of steering the light onto the solar cell surface. One such scheme is that proposed by Mills and Giutronich, Solar Energy 21 (1978), pp. 423–430, where the front and rear surfaces of a glass or equivalent structure are at an appropriate angle to each other to ensure that light reflected from the rear surface strikes the glass/air interface at the top surface outside the escape angle and is therefore totally internally reflected. In this scheme, a solar cell is mounted perpendicular to the top surface and at the end of the wedge-shaped structure so as to receive the light that has been trapped within the structure. This scheme is shown in FIG. 1 which is a schematic cross section side view of a device 100 for directing light in two dimensions. In FIG. 1 a beam of incoming light 101 passes through top surface 102 of triangular glass structure 103 to point 104A, is reflected at point 104A by reflector 104 to point 102A, totally internally reflected at point 102A by surface 102 to point 104B and is reflected at point 104B by reflector 104 to point 105A where it is absorbed by top surface 105 of solar cell 106. One severe limitation of this scheme for many applications is the large value of θ required to ensure light reflected from reflector 104 is totally internally reflected when subsequently striking the glass/air interface at surface 102. This large value of θ results in dimension A having to be relatively large in comparison to dimension B unless the acceptance angle for incoming light 101 is greatly reduced. Furthermore, in this scheme, no light falls directly onto cell 106, only reflected light.

OBJECTS OF INVENTION

Objects of this invention are to provide a device for receiving and for directing light in a three dimensional manner to at least one predetermined location and a combination of the device and a photo-device having a light absorbing surface.

DISCLOSURE OF INVENTION

According to a first embodiment of this invention there is provided a device for receiving and for directing light in a three dimensional manner to at least one predetermined location, the device having at least one receiver/director for directing light in a three dimensional manner to a predetermined location, the receiver/director comprising:

a total internal reflection surface capable of transmitting incoming light into the device and of totally internally reflecting light within the device and incident the total internal reflection surface at an angle within the range for total internal reflection; and at least two light reflecting surfaces; wherein the reflecting surfaces and the total internal reflection surface are operatively disposed with respect to one another to reflect and direct incoming light, transmitted by the total internal reflection surface into the device, in a three dimensional manner to the predetermined location.

According to a second embodiment of this invention there is provided a combination comprising at least one device of the first embodiment together with at least one photo-device having a light absorbing surface, at least part of the light absorbing surface being operatively disposed at the predetermined location to absorb light reflected and directed by the receiver/director.

Generally, the receiver/director comprises a filled-in symmetric or asymmetric tilted groove. The filled-in portion of the groove comprises light transparent material. The reflecting surfaces may be covered with light reflecting material or may be totally internally reflecting surfaces. Alternatively, the groove could be a hollow symmetric or asymmetric tilted groove covered with the total internal reflection surface. The hollow portion of the latter groove could contain light transparent fluids including liquids.

Generally, the device has a plurality of receiver/directors, typically 2–1000, more typically 2–100 and even more typically 4–20. Alternatively, the device may also have one receiver/director. In the case where the device has one receiver/director the device may be the receiver/director. Alternatively, the device may be a structural component such as a brick, tile or may be part of a panel, and as indicated above the device may include 1 receiver/director or may include a plurality of receiver/directors.

Typically, the light absorbing surface is the underside of a photo-device.

Generally, the combination of the second embodiment comprises a plurality of devices of the first embodiment, typically 2–10,000, and a plurality of photo-devices, typically 2–10,000. Alternatively, the combination of the second embodiment may have one device which may have one receiver/director or a plurality of receiver/directors together with one photo-device or together with a plurality of photo-devices. As a further alternative, the combination of the second embodiment may have a plurality of devices each of which may have one receiver/director or a plurality of receiver/directors together with one photo-device. In the case where the device has one receiver/director the device may be the receiver/director. Typically, the combination of the second embodiment is in the form of a panel (including a roof panels and wall panels), a tile or a brick. Alternatively, the combination of the second embodiment may be in the form of panels for motor vehicles such as roof panels, boot panels, door panels, bonnet panels and other car panels.

Generally, in the combination of the second embodiment the device of the first embodiment further includes a reflector or an extension of one of the two reflecting light surfaces operatively disposed in relation to the total internal reflection surface and the light absorbing surface and/or the two light reflecting surfaces to directly reflect incident light from the total internal reflection surface and/or two light reflecting surfaces to the light absorbing surface.

Typically, the photo-device is a light converting cell, more advantageously a solar cell such as a p-n photo cell, an amorphous photo cell, a Schottky photo cell, a photoelectrochemical photo cell an MIS photo cell an n—n photo cell or a p—p photo cell. The photo cells may be for converting solar light, light from light sottrees such as tungsten and fluorescent tubes, photodiodes or lasers into electricity. Typically, the photo cell is a solar cell. Semiconductor substrate materials such as silicon, germanium, CdTe, CuInSe$_2$, GaAs, AlGaAs, GaP, GaAsP, SiC, InP and other photovoltaically active semiconductors are particularly suitable for p-n photovoltaic cells and particularly for p-n photovoltaic solar cells. The semiconductor substrate material can be thin films, single crystal or polycrystalline material. It may be continuous or discontinuous. Thin films may be supported on a transparent substrate or superstrate such as glass, quartz, perspex or other suitable superstrate. When the superstrate is transparent to the illuminating light the array can be illuminated through the superstrate. The semiconductor substrate material may be used with appropriate antireflection coatings and fabricated using appropriate antireflection geometries. To make use of light being steered into the rear of a photo cell or solar cell while other light is coupled into the top surface, a bifacial cell design is clearly necessary. A number of different solar cell technologies have developed and demonstrated bifacial solar cell designs. To make most effective use, however, of the proposed invention, the solar cell design is generally optimized and fabricated for operation at light intensity levels well above those normally experienced in conventional photovoltaic modules. To extract power from a solar cell, at least two connections of different potential must be made to the solar cell. To extract current, conductors are necessary to allow a current to flow to either an adjacent solar cell or out of the encapsulation. One effective way to conduct current from one location within the encapsulation to another, is to make use of a conductive rear reflector that is appropriately patterned and connected to the relevant solar cells.

The X, Y, Z directions for the purposes of this description are defined in FIG. 2 where the labelled axes are orthogonal to each other. The device of the present invention makes use of the third dimension where reflected light from the reflecting rear surfaces has its component in the Z direction altered by the reflection. The benefit of altering the Z component of the reflected light is that total internal reflection can then be achieved when the light subsequently strikes the top surface glass/air interface without the large values of θ necessary for the scheme of FIG. 1. Typically two reflecting surfaces form a tilted groove with one another and the totally reflecting surface is at the top of the groove whereby the magnitudes of the angles subtended by the reflecting surfaces to the total internal reflection surface in the Z-Y plane are such that normally incident light will restrike the total internal reflection surface at angles of magnitudes such that they are totally internally reflected at the total internal reflection surface and are simultaneously directed to one end of the tilted groove in the X-direction. The tilted groove may be symmetric or asymmetric. The magnitudes of the angles subtended by the reflecting surfaces to the total internal reflection surface in the X-Y plane do not play an important role with regard to causing total internal reflections at the total internal reflection surface until light has been reflected to the total internal reflection surface more than once. When this condition is reached, the multiple reflections will have already caused a sufficient component for the light in the X direction to have been established that will then cause total internal reflection at the total internal reflection surface for all subsequent occasions independent of the component for the light in the Z direction. Appropriate selection for the magnitudes of the angles subtended by the reflecting surfaces to the total internal reflection surface in the Z-Y plane and the magnitudes of the angles subtended by the reflecting surfaces to the total internal reflection surface in the X-Y plane will lead to the majority of incident light for all significant angles of incidence to be reflected and directed within the receiver/ director. The other important feature of the angles subtended by the reflecting surfaces to the total internal reflection surface in the Z-Y plane is that they cause incident light to accumulate an increased component of travel in the X direction for each reflection from each of the reflecting surfaces. This acts to steer the light in the X direction to a predetermined location where a photovoltaically active cell, for example, may be located.

The receiver/director may be formed from a transparent medium in shape of a tilted groove, the transparent material being selected from a range of glasses, acrylics, epoxies, plastics, polymers or pottant materials, for example. For a glass structure, moulding or perhaps rolling could be used. Another approach would be to use a plastic or equivalent moulding or machine or fabricate an appropriate material to form the tilted grooves, coating the top surfaces of the moulding, machined or fabricated grooves to make the top surfaces reflective and filling the grooves with a transparent material such as EVA to fill and form the optical cavities and the total internal reflection surface.

The devices of the invention steer laterally to photo cells, typically, solar cells, incident light that would not otherwise illuminate the cells. The structures make use of total internal reflection to prevent light from escaping the same surfaces through which the incoming light passed. In one particular embodiment of the invention, a photovoltaic module can incorporate these structures to allow a reduced packing factor for the photovoltaic cells while still allowing virtually all incident light onto the module to be transferred to the solar cells. In this application, light incident on non-cell areas is steered laterally through the use of total internal reflection at the air interface into photovoltaically active regions where the cells are located. The resulting reduced packing factors (typically 20–50%) facilitate substantial reduction for the cost per unit of electricity generated since the photovoltaic cell cost in conventional photovoltaic module design substantially dominates the total encapsulation costs.

BRIEF DESCRIPTION OF DRAWINGS

The preferred embodiments of the invention are now described with reference to the following drawings in which.

BEST MODE AND OTHER MODES FOR CARRYING OUT INVENTION

Figure 1:
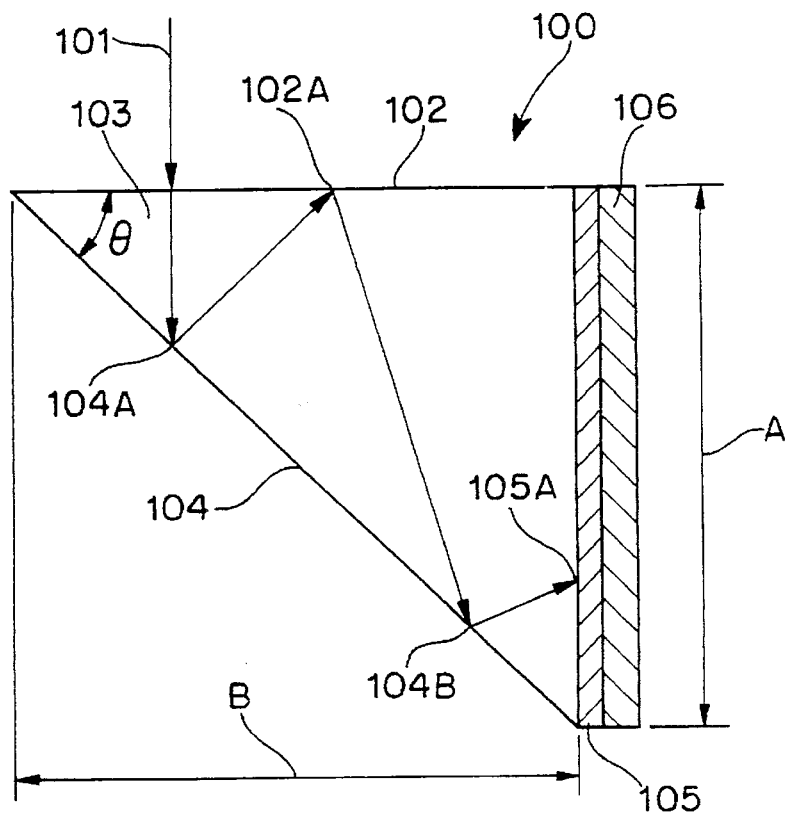
FIG. 1 is a schematic cross section side view of a device for directing light in two dimensions.
Figure 2:
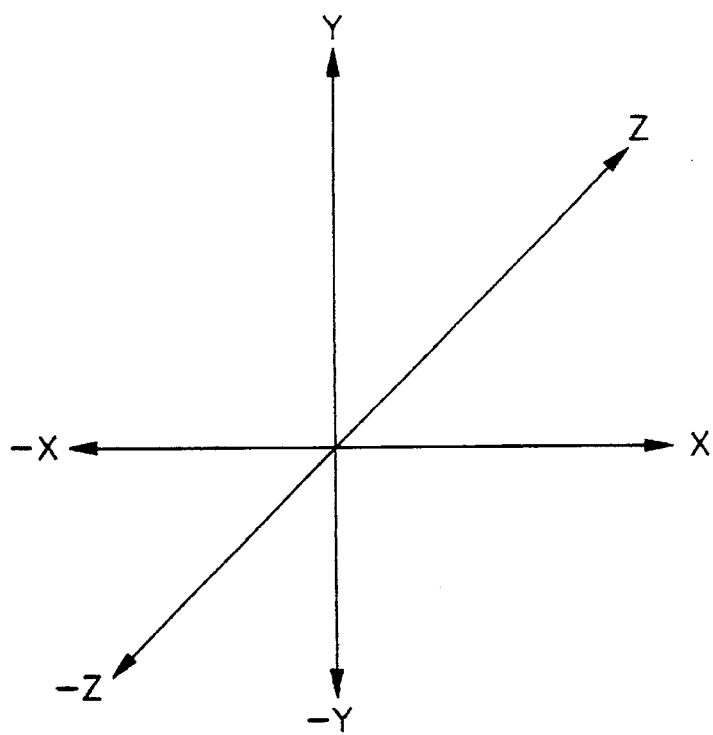
FIG. 2 depicts orthogonal axes X, Y and Z.
Figure 3:
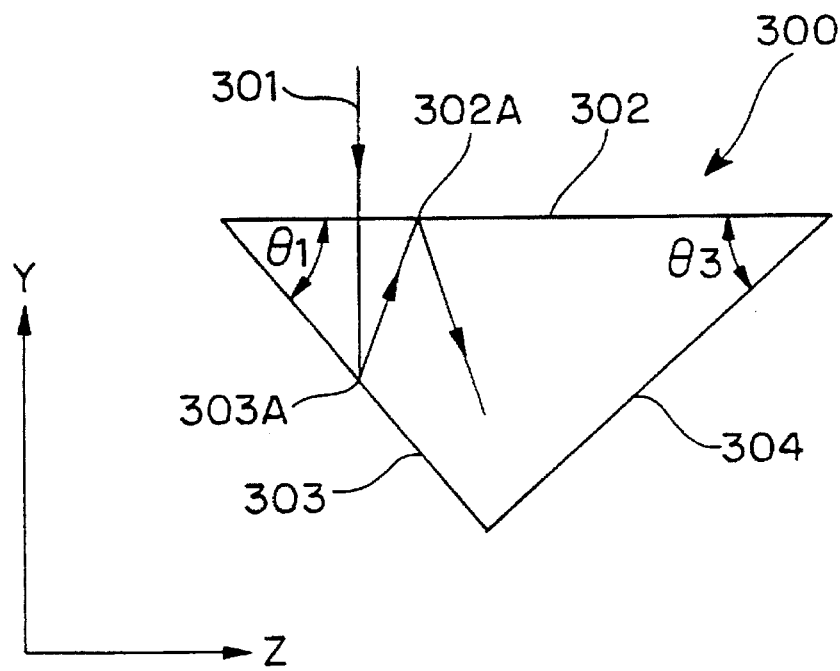
FIG. 3 schematically depicts a cross-section, in the Y-Z plane, of a solid, transparent tilted groove of the invention.
Figure 4:
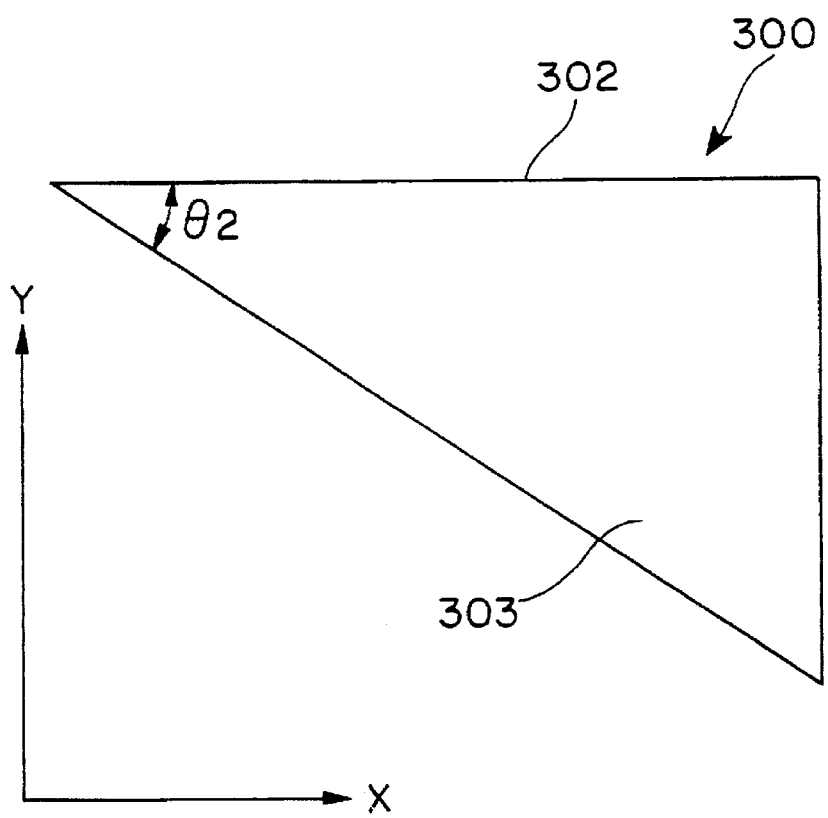
FIG. 4 schematically depicts a cross-section, in the X-Y plane, of a solid, transparent tilted groove of the invention.
Figure 5:
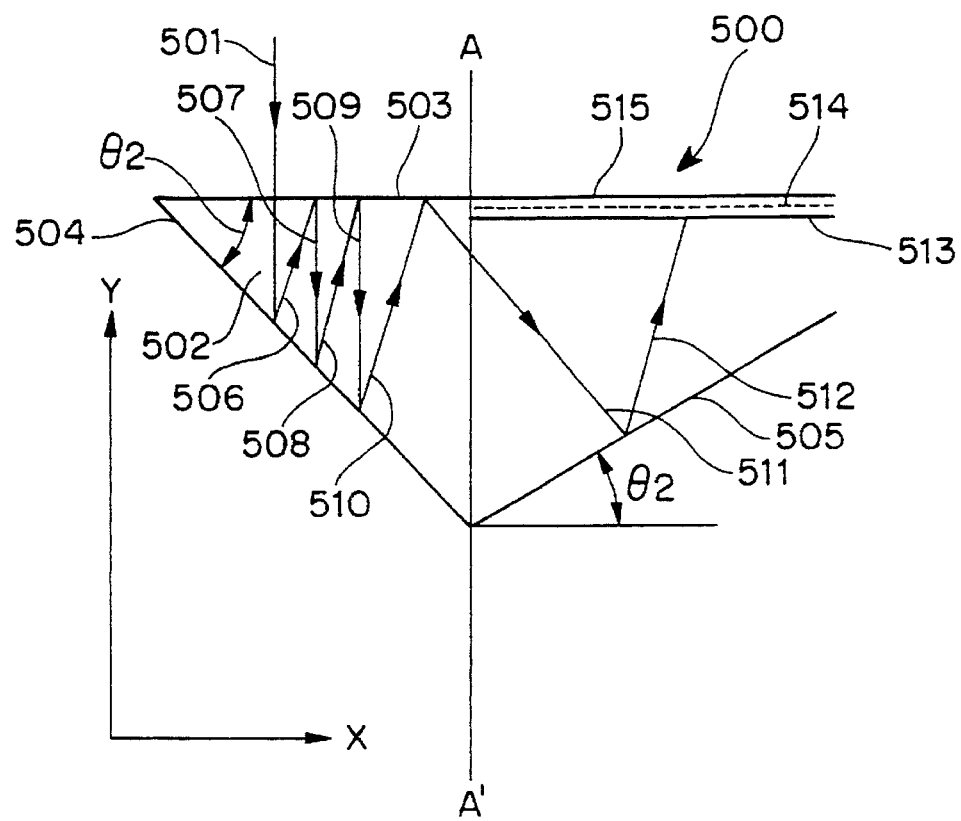
FIG. 5 schematically depicts a cross-section, in the X-Y plane, of a solid, transparent tilted groove of the invention operatively disposed in relation to an adjacent solar cell and a reflector under the solar cell to direct light to the reflector which in turn reflects light to the underside of the solar cell.
Figure 6:
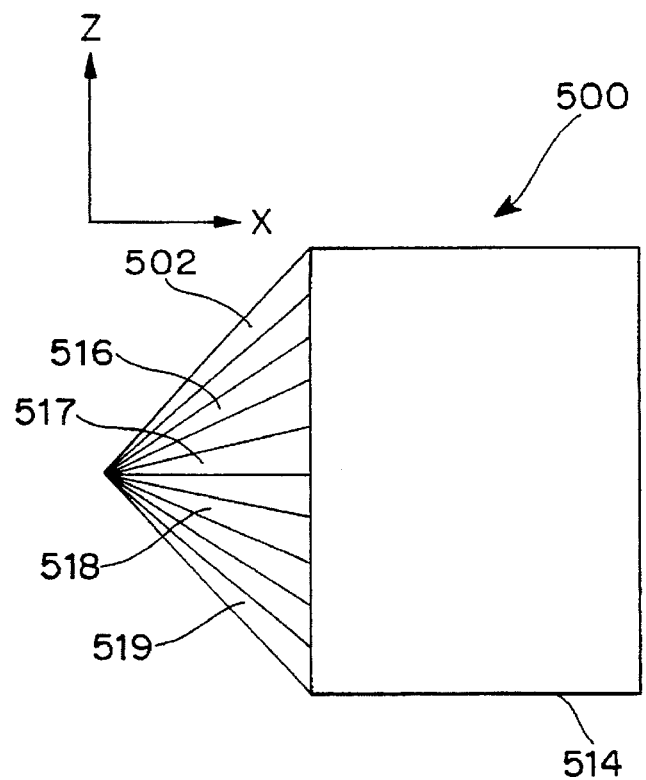
FIG. 6 schematically depicts a plan view of 5 solid, transparent tilted grooves of the invention operatively disposed to receive and direct light into the underside of an adjacent solar cell.

The scheme of FIG. 1 is basically two-dimensional with no attempt to alter the light's component of travel in the Z direction (third dimension). The X, Y, Z directions for the purposes of this description are defined in FIG. 2 where the labelled axes are orthogonal to each other. The present invention makes use of the third dimension where reflected light from a reflector surface located at the rear of a device has its component in the Z direction altered by the reflection. The benefit of altering the Z component of the reflected light is that total internal reflection can then be achieved when the light subsequently strikes top surface glass/air interface at the top of the device without the large values of θ necessary for the scheme of FIG. 1. A scheme that has demonstrated very effective light trapping and steering capabilities is that of tilted grooves. A cross-section of a glass tilted groove 300 in the Z-Y plane is shown in FIG. 3. Tilted groove 300 has glass/air interface 302 and rear reflecting surfaces 303 and 304. If the angle θ1 is greater than 22.5°, then normally incident light 301 as shown in FIG. 3 will restrike glass/air interface 302 at an angle of greater than 45° to the normal after a single reflection from rear reflecting surface 303 at point 303A and hence be totally internally reflected at top surface glass/air interface 302 as shown at point 302A. This total internal reflection will occur irrespective of the tilt angle of the rear surface in the X direction as given by the angle θ in FIG. 1. The equivalent angle θ2 in the X direction for the present scheme is shown in FIG. 4 which represents a cross-section of the tilted groove 300 in the X-Y plane. This angle, θ2, does not play an important role with regard to causing total internal reflections at top surface glass/air interface 302 until light has been reflected to this top surface glass/air interface 302 more than once. When this condition is reached, the multiple reflections will have already caused a sufficient component for the light in the X direction to have been established that will then cause total internal reflection at the top surface glass/air interface 302 for all subsequent occasions independent of the component for the light in the Z direction. Appropriate selection for the angles θ1 and θ2 will allow the majority of incident light for all significant angles of incidence to be trapped within the transparent medium as indicated by the cross-sections in FIG. 3 and FIG. 4. The other important feature of the angle θ2 is that it causes incident light 301 to accumulate an increased component of travel in the X direction for each reflection from rear reflecting surfaces 303 and 304. This acts to steer the light in the X direction to a predetermined location where a photovoltaically active cell is located. One implementation of the present invention is combination 500 shown in FIG. 5 which is a cross-section in the X-Y plane where again the planes are defined by FIG. 2. In FIG. 5, incident light 501 on device 502 is shown to be steered laterally by internal reflection surface 503 and reflecting surfaces 504 and 505 via paths 506, 507, 508, 509, 510, 511 and 512 in the X direction and into rear 513 of solar cell 514. Solar cell 514 could have been located in place of reflecting surface 505 to allow all light to enter front surface 515 of solar cell 514. One benefit of the configuration of FIG. 5, however, is that the location of solar cell 514 as shown aids the dissipation of heat from solar cell 514. The photovoltaic solar cell 514 could in fact be located anywhere from the top surface adjacent surface 503 as shown in FIG. 5 to rear surface 505 (which could be horizontal for the case θ2'=0) depending on thermal considerations and the desired balance between how much light enters front 515 of cell 514 relative to that entering rear 513 of cell 514. Ease of manufacture and cell interconnection etc. may also influence this preferred position. The geometry of reflecting surface 505 located directly beneath solar cell 514 is selected to optimize the directing of light up to rear surface 505 of solar cell 514. Its actual geometry could be simply the mirror image of rear surface 505 reflected in the AA' plane as shown in FIG. 5 with θ2 =θ2', although for some cell sizes and shapes, it is preferable to use a rear reflector slope (θ2') that progressively increases with distance in the X direction from the AA' plane (edge of solar cell 514) in line with the centre of solar cell 514. In general, the preferred geometry and angle for θ2' as a function of distance in the X direction are determined by solar cell 514 shape, size and its electrical and optical characteristics for example, the distribution of light intensity across cell surface 513 will be determined primarily by the shape of surface 505, with large variations in light intensity able to be tolerated without significant loss in performance by only some solar cell technologies such as the buried contact solar cell. FIG. 6 shows a view of combination 500 looking downwards in the minus Y direction at the top surfaces of the combination which occurs in the X-Z plane. Combination 500 only shows five tilted grooves 502, 516, 517, 518 and 519 located on one side of solar cell 514, but could clearly be located equivalently on all other sides. This implementation of tilted grooves 502, 516, 517, 518 and 519 makes use of five tilted grooves for a side of solar cell 514 although the number of grooves can be significantly varied from one up to virtually any number. In conjunction with the number of grooves, the angles θ1 (see for example FIG. 3), θ2 (see for example FIG. 5) and θ3 (see for example FIG. 3), can be selected to optimize performance. The actual values for θ1, θ2 and θ3 could potentially lie within a large range of angles, bounded at one extreme by the case where most reflected light at surface 503 is no longer totally internally reflected and at the other extreme where device 502 dimensions are no longer practical (particularly the thickness) for fabrication and use.

Figure 7:
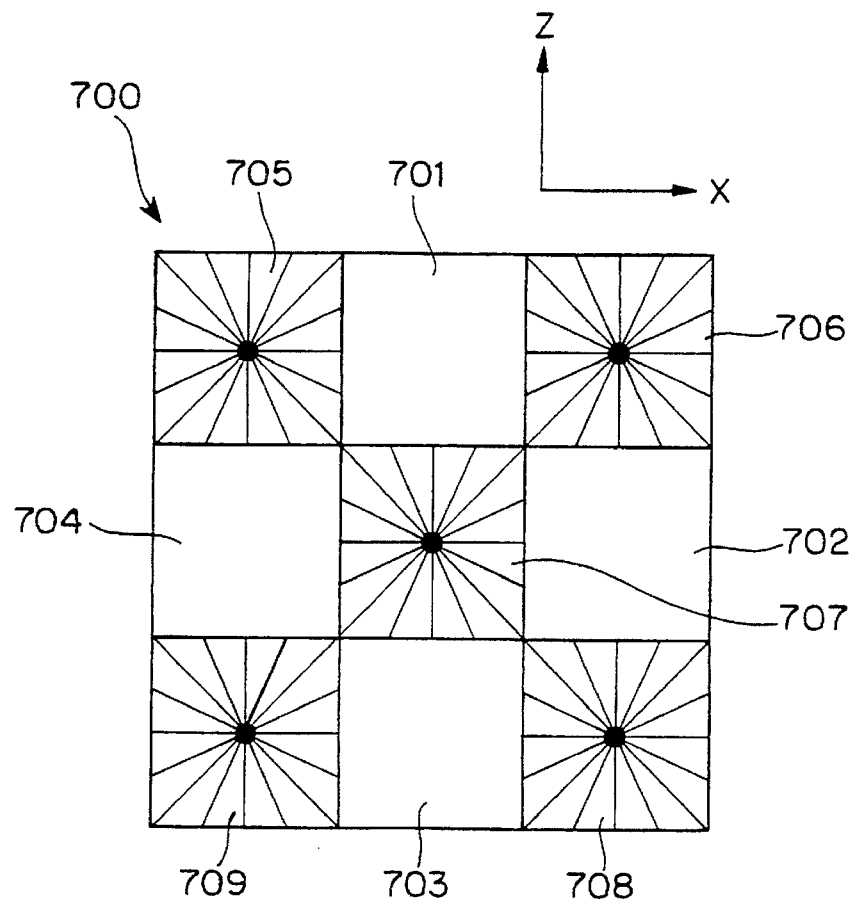
FIG. 7 schematically depicts a plan view of a panel comprising a checkerboard layout of a plurality of devices for receiving and for directing light in a three dimensional manner into the undersides of adjacent solar cells.

FIG. 7 shows a plurality of combinations of the type shown in FIGS. 5 and 6 incorporated in panel subsection 700. In FIG. 7 panel subsection 700 has a plurality of solar cells 701, 702, 703 and 704 configured in a checkerboard pattern with all non-cell areas 705, 706, 707, 708 and 709 utilizing tilted grooves of the type shown in FIGS. 5 and 6 to steer the majority of light incident on these regions to photovoltaically-active regions where solar cells 701, 702, 703 and 704 are located.

Figure 8:
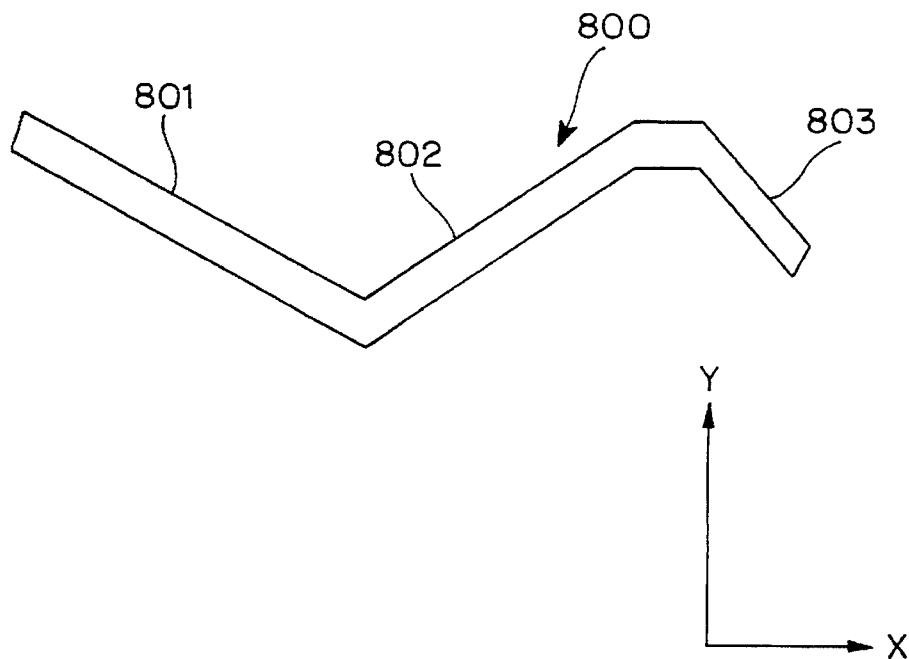
FIG. 8 schematically depicts a cross-section, in the X-Y plane, of a plastic moulding, which with a reflective top surface, may form the reflective rear surface of a solid, transparent tilted groove of FIG. 5.
Figure 9:
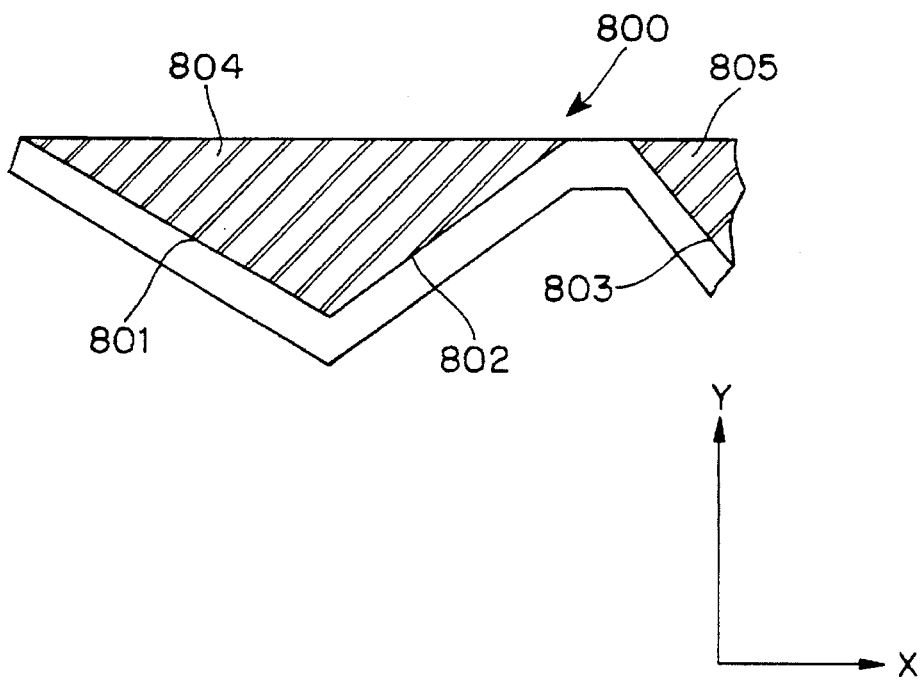
FIG. 9 schematically depicts a cross-section, in the X-Y plane, of a solid, transparent tilted groove of the invention, where the transparent medium is formed by the use of ethyl vinyl acetate or other appropriate transparent material in conjunction with a plastic moulding with a reflective top surface of FIG. 8.

The transparent medium in device 502 could be formed from a range of glasses, acrylics, plastics, polymers or pottant materials, etc. For a glass structure, moulding or perhaps rolling could be used. Another approach would be to use a plastic or equivalent moulding 800 with a typical shape as shown in FIG. 8 to provide the same effect of the rear surface as shown in FIG. 5. In this instance, top surfaces 801, 802 and 803 of plastic moulding 800 would be coated to make surfaces 801,802 and 803 reflective, hence making each of them equivalent to reflecting surfaces 504 and 505 of FIG. 5. Optical cavities 804 and 805 would then be formed as shown in FIG. 9 where the shaded area shows the use of a transparent material such as EVA to fill and form optical cavities 804 and 805.

To make use of light being steered into rear surface 513 of solar cell 514 while other light is coupled into top surface 515, a bifacial cell design is clearly necessary. A number of different solar cell technologies have developed and demonstrated bifacial solar cell designs. To make most effective use, however, of the proposed invention, the solar cell design needs to be optimized and fabricated for operation at light intensity levels well above those normally experienced in conventional photovoltaic modules.

To extract power from a solar cell, at least two connections of different potential must be made to the solar cell. To extract current, conductors are necessary to allow a current to flow to either an adjacent solar cell or out of the encapsulation. One effective way to conduct current from one location within the encapsulation to another, is to make use of a conductive rear reflector that is appropriately patterned and connected to the relevant solar cells.

A photovoltaic panel formed from the configuration of FIG. 7 will have a solar cell packing factor of approximately 50%. This packing factor can be reduced to lower values although the performance of the transparent regions and rear reflecting surfaces in steering the light laterally to adjacent solar cells will often be slightly reduced. By replacing the square solar cells 701,702, 703 and 704 of FIG. 7 with round solar cells that use a diameter equal to the side dimension of the square solar cells 701, 702, 703 and 704, the packing factor is reduced to approximately 39%. To prevent significant losses from the tilted grooves directing light to where the corners of the square solar cells 701, 702, 703 and 704 had previously been, the grooved geometry for these particular grooves can be modified in the vicinity of each solar cell. Alternatively, the number of grooves being used in FIG. 7 can be beneficially reduced with even a single groove acting to quite effectively couple the light into the adjacent solar cell. As the solar cell dimensions are increased or decreased, the groove lengths must also be reduced or increased correspondingly so that they always terminate in the vicinity of the cell edges. Another important angle other than θ1 and θ2 of FIGS. 3 and 4 respectively is θ3 of FIG. 3 which can be varied relative to θ1 to provide asymmetry for tilted groove 300 in the Y-Z plane. Such asymmetry adds an additional valuable component of flexibility with regard to optimizing the structures for multiply totally internally reflecting light that strikes the glass/air interface 302. It can also facilitate optimization for conditions such as when light predominantly enters tilted groove 300 within a range of angles due to the way tilted groove 300 has been mounted. It is also possible by varying θ2 and θ3 appropriately to form a tilted groove 300 in which a significant amount of light can be totally internally reflected from all glass/air interfaces even without the use of a rear reflector on reflecting surface 303. This may be of particular benefit in some applications.

The schemes described so far based on the concept of tilted grooves for light trapping and steering have related primarily to photovoltaic module design and construction. Many other applications, however, exist in which solar cells are encapsulated in a way that can take advantage of this invention. Another example would be for roof tiles where one or more solar cells could be incorporated into a roof tile with each cell being surrounded by tilted grooves to transfer light incident on adjacent regions into the solar cells. One advantage of this application is that the roof tile structures could afford in general to be somewhat thicker and bulkier than a conventional photovoltaic module therefore giving greater flexibility to the selection of the angles θ2 and θ3 to optimize the light capture and transfer and to enable light to be collected for larger distances away from the solar cell edges. A third application would be in solar cars where regions of the car surface exist where it is not practical or legal to incorporate solar cells. These regions could have tilted grooves which act to steer light incident on those areas relatively long distances to solar cells located elsewhere on the car. Again, this is an application where potentially thick structures can be used, therefore enabling light to be transferred laterally by quite large distances. For instance, if the angle θ2 in FIG. 4 is 15°, then a depth in tilted groove 300 of about half a meter would allow light incident on the solar car up to 2 meters away from the cell edge to be coupled and steered across to where the relevant cell is located. In this particular application, it may be advantageous to mount additional solar cells perpendicularly to those near the top surface specifically for the purpose of capturing this laterally-transferred light incident on the non-cell areas. Such cells would in this case be mounted in the Y-Z plane instead of the more usual X-Z plane (which would be the case for all the cells mounted along the top surface of the solar ear capturing the light directly).

Figure 11:
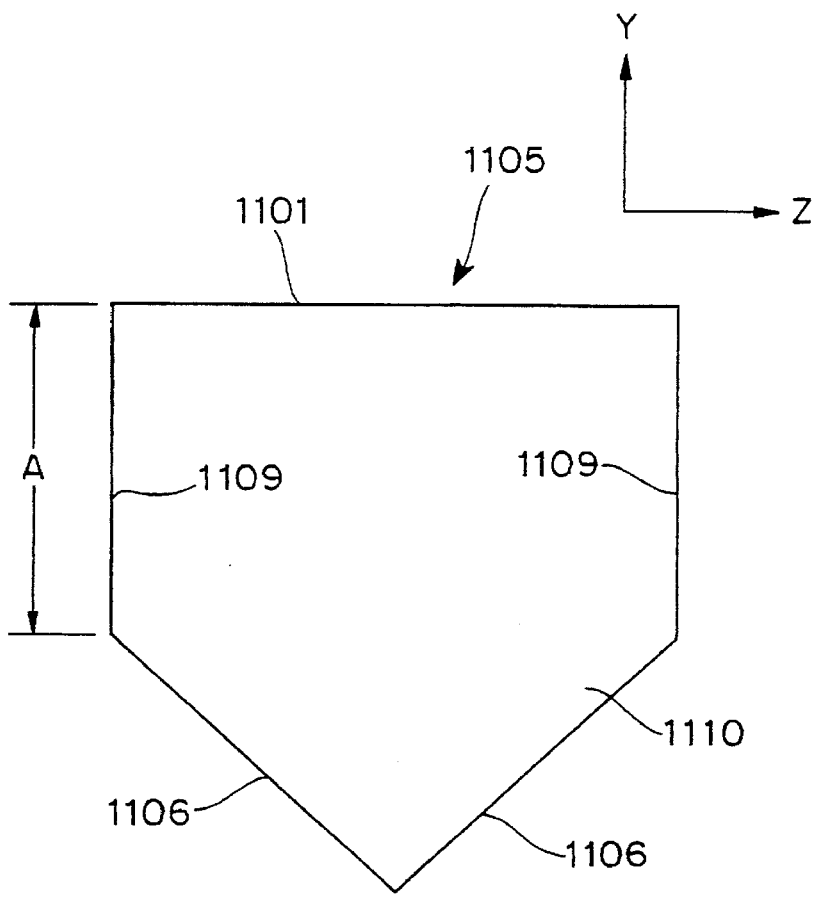
FIG. 11 schematically depicts a cross-section of one of the grooves of the photovoltaic roof tie of FIG. 10 in the YZ plane.
Figure 10:
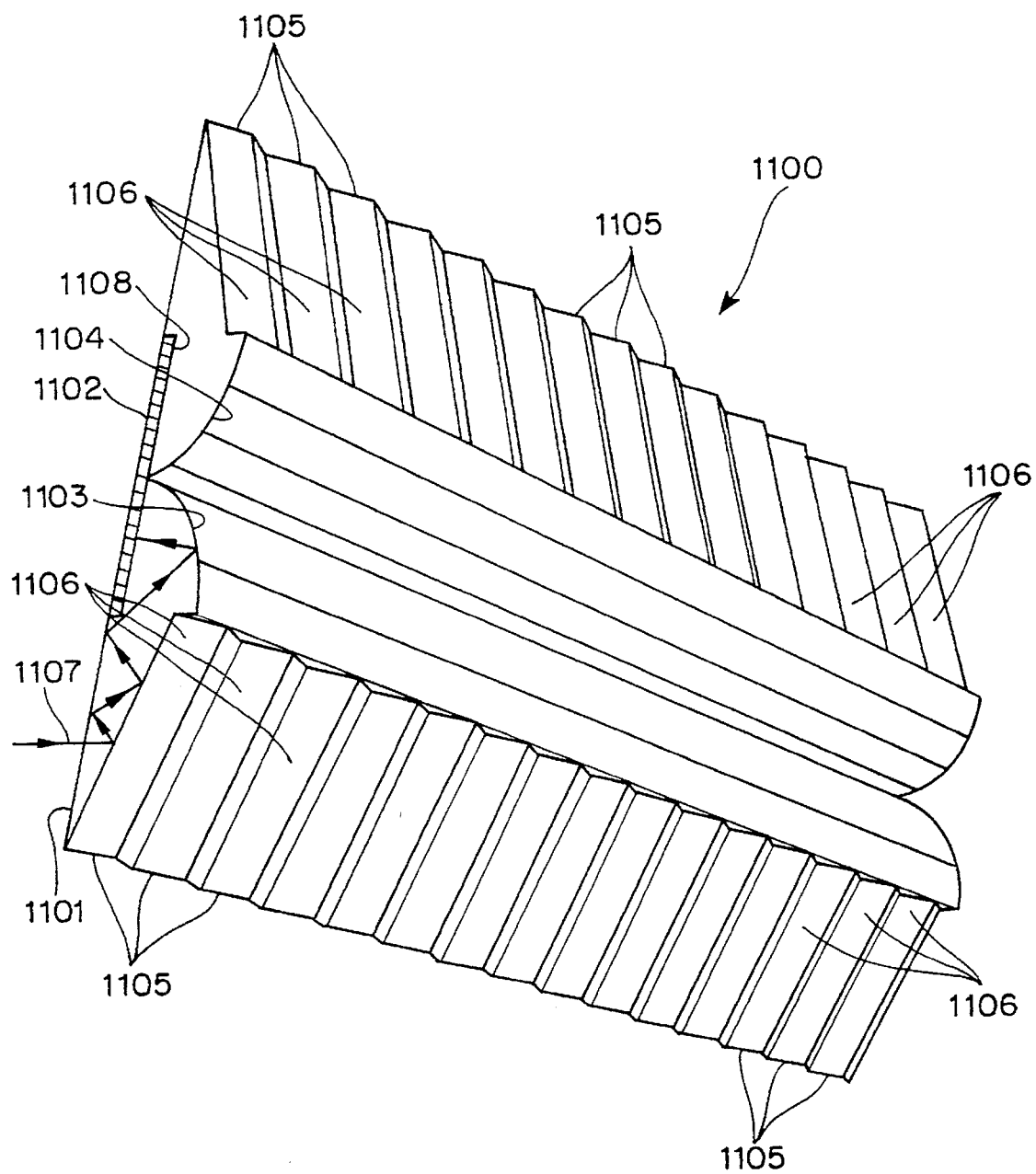
FIG. 10 schematically depicts a photovoltaic roof tile.

FIG. 7 depicts tilted grooves appearing as triangular formations when viewed from the light source. It is also possible and often desirable for these tilted grooves to appear as rectangles when viewed from above (from the light source) as would be the case in the Example of FIG. 10 which depicts a solar photovoltaic roof tile 1100. Tile 1100 has a light receiving surface 1101, solar photovoltaic cell(s) 1102 located above curved rear surfaces 1103 and 1104, and tilted grooves 1105 having light reflective rear surfaces 1106. Tilted grooves 1105 behave equivalently to the tilted grooves previously discussed with reference to the earlier diagrams. FIG. 11 depicts how an incoming light beam 1107 is steered by tilted groove 1105 and curved rear surface 1103 towards the centre of tile 1100 to the rear surface 1108 of cell 1102(s). FIG. 11 shows the cross-section of one of tilted grooves 1105 in the YZ plane, having light receiving surface 1101, light reflective surfaces 1106 which form the base of groove 1105 and interface borders 1109 which correspond to the interfaces with adjacent grooves. Light receiving surface 1101 is also responsible for total internal reflections of light reflected from surfaces 1106. Groove 1105 is filled with solid transparent medium 1110 and is substantially equivalent to that of FIG. 3 except that the dimension "A" reduces further the distance from the edge of the solar cell.

We claim:

1. A light receiver-director device for directing received light to at least one predetermined location, comprising:

a total-internal-reflection surface for the received light into the light receiver-director device, and for totally internally reflecting light incident from within the light receiver-director device at an angle within a total reflection range; and a reflector having at least two reflector surfaces which are mutually disposed so as to form a groove having a base, with the groove being configured and disposed relative to the total-internal-reflection surface such that the base of the groove is at a tilt relative to the total-internal-reflection surface, and such that admitted light which has been reflected by at least one of the two reflector surfaces ultimately reaches the predetermined location.

2. The light receiver-director device according to claim 1, further comprising a transparent material in the groove.

3. The light receiver-director device according to claim 2, wherein the transparent material is a liquid.

4. The light receiver-director device according to claim 1, wherein the total-internal-reflection surface covers the reflector.

5. The light receiver-director device according to claim 1, wherein, for reflectance, a reflecting surface layer is included on at least one of the reflector surfaces.

6. The light receiver-director device according to claim 1, wherein at least one of the reflector surfaces has reflectance due to total internal reflection.

7. The light receiver-director device according to claim 1, comprising a plurality of reflectors.

8. The light receiver-director device according to claim 7, wherein the plurality includes from 4 to 60 reflectors.

9. The light receiver-director device according to claim 1, wherein the light receiver-director device is configured as one of a brick, a tile, and a part of a panel.

10. The light receiver-director device according to claim 1, 2, 3, 4, 5, 6, 7, 8 or 9 wherein angles subtended by the reflector surfaces to the total-internal-reflection surface in a Z-Y plane are such that normally incident light will re-strike the total-internal-reflection surface at an angle of total internal reflection and for X-direction of the light to one end of the groove.

11. A combination comprising at least one light receiver-director device according to claim 1 together with at least one photo-device having a light absorbing surface, at least part of the light absorbing surface being operatively disposed at the predetermined location to absorb light received and directed by the receiver-director device.

12. The combination according to claim 11, further comprising a transparent material in the groove of the light receiver-reflector device.

13. The combination according to claim 12, wherein the transparent material is a liquid.

14. The combination according to claim 11, wherein the total-internal-reflection surface of the light receiver-director device covers the reflector.

15. The combination according to claim 11, wherein, for reflectance, a reflecting surface layer is included on at least one of the reflector surfaces of the light receiver-director device.

16. The combination according to claim 11, wherein at least one of the reflector surfaces of the light receiver-director device has reflectance due to total internal reflection.

17. The combination according to claim 11, wherein the light receiver-reflector device comprises a plurality of reflectors.

18. The combination according to claim 17, wherein the plurality includes from 4 to 60 reflectors.

19. The combination according to claim 11, wherein the light receiver-director device is configured as one of a brick, a tile, and a part of a panel.

20. The combination according to claim 11, wherein the photo-device has an underside which serves as the light absorbing surface.

21. The combination according to claim 11, wherein the photo-device is a light conversion cell.

22. The combination according to claim 21, wherein the light conversion cell is one of a p-n photo cell, an amorphous photo cell, a Schottky photo cell, a photoelectrochemical photo cell, an MIS photo cell, an n—n photo cell, and a p—p photo cell.

23. The combination according to claim 21, wherein the light conversion cell is one of a solar cell, a tungsten light conversion cell, a halogen light conversion cell, a fluorescent light conversion cell, a photodiode light conversion cell, and a laser light conversion cell.

24. The combination according to claim 21, wherein the light conversion cell is a p-n solar cell comprising, for light conversion, a material selected from the group consisting of Si, GaAs, AlGaAs, Ge, CdTe, $CuInSe_2$, GaP, GaAsP, and InP.

25. The combination according to claim 11, 12, 13, 14, 15, 16, 17, 18, 19, 20, 21, 22, 23 or 24, wherein, in the light receiver-director device, angles subtended by the reflector surfaces to the total-internal-reflection surface in a Z-Y plane are such that normally incident light will re-strike the total-internal-reflection surface at an angle of total internal reflection and for X-direction of the light to one end of the groove.

26. The combination according to claim 11, comprising a plurality of light receiver-director devices.

* * * * *

UNITED STATES PATENT AND TRADEMARK OFFICE
CERTIFICATE OF CORRECTION

PATENT NO. : 5,646,397
DATED : July 8, 1997
INVENTOR(S) : Wenham et al.

It is certified that error appears in the above-identified patent and that said Letters Patent is hereby corrected as shown below:

Column 3, line 16, "sottrees" should read --sources--;

Column 5, line 27, "roof fie" should read --roof tile--;

Column 8, line 43, "ear" should read --car--;

Column 9, line 4, "surface for" should read --surface for admitting--.

Signed and Sealed this

Twenty-first Day of April, 1998

Attest:

BRUCE LEHMAN

*Attesting Officer*    *Commissioner of Patents and Trademarks*

UNITED STATES PATENT AND TRADEMARK OFFICE
CERTIFICATE OF CORRECTION

PATENT NO.   : 5,646,397
DATED        : July 8, 1997
INVENTOR(S)  : Wenham et al.

It is certified that error appears in the above-identified patent and that said Letters Patent is hereby corrected as shown below:

```
On the title page, item [22], the filing date should read --August 6, 1996--
```

Signed and Sealed this

Twenty-second Day of September, 1998

Attest:

BRUCE LEHMAN

*Attesting Officer*                *Commissioner of Patents and Trademarks*

UNITED STATES PATENT AND TRADEMARK OFFICE
CERTIFICATE OF CORRECTION

PATENT NO. : 5,646,397

DATED : July 8, 1997

INVENTOR(S) : Wenham et al.

It is certified that error appears in the above-identified patent and that said Letters Patent is hereby corrected as shown below:

Column 6, line 32, "505" should read --513--.

Signed and Sealed this

Thirtieth Day of March, 1999

Attest:

Q. TODD DICKINSON

*Attesting Officer*     *Acting Commissioner of Patents and Trademarks*